US012713643B2

(12) United States Patent
Chen et al.

(10) Patent No.: US 12,713,643 B2
(45) Date of Patent: Aug. 18, 2026

(54) SEMICONDUCTOR DEVICE WITH FLOATING MAIN BODY REGION VERTICALLY SEPARTING SOURCE FROM DRAIN AND METHOD OF FORMING THE SAME

(71) Applicant: Winbond Electronics Corp., Taichung City (TW)

(72) Inventors: Yu-Ting Chen, Kaohsiung City (TW); Kai Jen, Taichung City (TW)

(73) Assignee: WINBOND ELECTRONICS CORP., Taichung City (TW)

( * ) Notice: Subject to any disclaimer, the term of this patent is extended or adjusted under 35 U.S.C. 154(b) by 352 days.

(21) Appl. No.: 18/448,541

(22) Filed: Aug. 11, 2023

(65) Prior Publication Data

US 2024/0332418 A1 Oct. 3, 2024

(30) Foreign Application Priority Data

Mar. 30, 2023 (TW) ................................ 112112224

(51) Int. Cl.

| | |
|---|---|
| ***H10D 30/63*** | (2025.01) |
| ***H10D 30/01*** | (2025.01) |
| ***H10D 30/67*** | (2025.01) |
| ***H10D 64/23*** | (2025.01) |

(52) U.S. Cl.

CPC ........... *H10D 30/63* (2025.01); *H10D 30/025* (2025.01); *H10D 30/6735* (2025.01); *H10D 64/252* (2025.01); *H10D 64/258* (2025.01)

(58) Field of Classification Search

CPC ........ H10B 63/34; H10B 12/30; H10B 12/05; H10D 30/63; H10D 84/016; H10D 84/0195; H10D 30/0291–0297; H10D 30/66–669; H10D 30/6728; H10D 64/679; H10D 64/687; H10D 30/025; H10D 30/6735; H10D 64/252; H10D 64/258

See application file for complete search history.

(56) References Cited

U.S. PATENT DOCUMENTS 5,977,589 A * 11/1999 Schloesser ............ H10B 12/01 257/302
6,246,122 B1 * 6/2001 Lin ...................... H10W 72/90 257/E23.079
6,524,920 B1 * 2/2003 Yu ....................... H10D 64/691 438/303

(Continued)

FOREIGN PATENT DOCUMENTS

TW 201913963 A 4/2019
TW 202310371 A 3/2023

*Primary Examiner* — Maliheh Malek
(74) *Attorney, Agent, or Firm* — MUNCY, GEISSLER, OLDS & LOWE, P.C.

(57) ABSTRACT

A semiconductor device includes: a substrate; a source region disposed on the substrate; a drain region disposed on the source region; and a floating main body region disposed between the source region and the drain region. The floating main body region vertically separates the source region from the drain region. The semiconductor device further includes: a gate region laterally wrapped around the floating main body region; and a gate dielectric located between the floating main body region and the gate region, and insulated the floating main body region from the gate region. A material of the gate dielectric has a negative capacitance feature.

15 Claims, 10 Drawing Sheets

(56) References Cited

U.S. PATENT DOCUMENTS 6,861,684 B2 * 3/2005 Skotnicki ............. H10D 30/025
257/302
7,221,586 B2 * 5/2007 Forbes ................. H10D 64/685
365/72
7,446,372 B2 * 11/2008 Forbes .................. G11C 11/405
257/E21.654
7,893,476 B2 * 2/2011 Verhulst ............... H10D 62/118
257/E29.264
8,072,012 B2 * 12/2011 Verhulst ............... H10D 62/121
257/288
8,319,288 B2 * 11/2012 Masuoka ............... H10D 84/85
257/369
9,257,571 B1 * 2/2016 Tseng ................... H10D 30/696
9,502,514 B2 * 11/2016 Wu ........................ H10B 41/10
9,543,401 B2 * 1/2017 Kim ....................... H10D 30/63
10,008,578 B1 * 6/2018 Lee ...................... H10D 64/679
10,026,658 B2 * 7/2018 Tsai ..................... H10D 62/122
10,461,184 B1 * 10/2019 Cheng .................... H10D 30/63
10,686,069 B2 * 6/2020 Kim ....................... H10D 30/63
11,189,708 B2 * 11/2021 Yeong .................. H10D 64/017
11,264,320 B1 * 3/2022 Eppich ................ G11C 11/4097
11,515,417 B2 * 11/2022 Sills ....................... H10D 30/63
11,956,940 B2 * 4/2024 Doornbos .............. H10D 30/62
12,096,623 B2 * 9/2024 Zhu ........................ H10D 30/68
2004/0262681 A1 * 12/2004 Masuoka ........... H10D 30/6757
257/E21.415
2006/0249770 A1 * 11/2006 Huo ..................... H10D 86/201
257/296
2008/0067495 A1 * 3/2008 Verhulst ............... H10D 62/118
257/E21.409
2008/0277708 A1 * 11/2008 Mun ...................... H10B 12/05
257/E29.345
2011/0241122 A1 * 10/2011 Masuoka ............... H10B 10/00
257/E27.099
2011/0303973 A1 * 12/2011 Masuoka ........... H10D 30/6735
257/329
2012/0241837 A1 * 9/2012 Takashima ......... G11C 16/0483
257/E27.081
2014/0021485 A1 * 1/2014 Cho ..................... H10D 30/025
257/77
2015/0243544 A1 * 8/2015 Alptekin ............. H10W 20/072
438/586
2015/0295040 A1 * 10/2015 Tsai ..................... H10D 62/122
438/224
2016/0042960 A1 * 2/2016 Kim ....................... H10D 30/63
438/269
2016/0163816 A1 * 6/2016 Yu ........................ H10D 30/024
438/283
2016/0308013 A1 * 10/2016 Masuoka ........... H10D 30/6735
2016/0365426 A1 * 12/2016 Ching .................. H10D 30/024
2017/0365659 A1 * 12/2017 Cheng .................. H10D 62/115
2019/0043991 A1 * 2/2019 Tan ...................... H10D 30/681
2019/0067325 A1 * 2/2019 Yano .................. G11C 16/0466
2019/0296155 A1 * 9/2019 Sawabe .............. H10D 30/6757
2020/0083329 A1 * 3/2020 Cho ..................... H10D 62/812
2020/0098930 A1 * 3/2020 Le ...................... H10D 30/6743
2020/0111908 A1 * 4/2020 Sills ....................... H10D 30/63
2020/0303497 A1 * 9/2020 Yeh ........................ H10D 30/63
2021/0119010 A1 * 4/2021 Yeong .................. H10D 64/679
2021/0210634 A1 * 7/2021 Lee ........................ H10D 30/63
2021/0305431 A1 * 9/2021 Ishimaru ............ H10D 30/6755
2021/0375874 A1 * 12/2021 Doornbos ............ H10N 70/011
2022/0085043 A1 * 3/2022 Zhu ...................... H10D 64/017
2023/0171937 A1 * 6/2023 Doornbos ............ H10B 12/395
257/296
2023/0189516 A1 * 6/2023 Yang ...................... H10B 12/20
257/314
2023/0380142 A1 * 11/2023 Chen .................... H10B 12/395
2024/0096964 A1 * 3/2024 Bao ...................... H10D 62/405
2024/0215217 A1 * 6/2024 Doornbos .............. H10B 12/05
2024/0381620 A1 * 11/2024 Sun ...................... H10B 12/312
2025/0071966 A1 * 2/2025 Kim ..................... H10B 12/315
2025/0098149 A1 * 3/2025 Liu ...................... H10B 12/395
2025/0159863 A1 * 5/2025 Sun ........................ H10B 12/05
2025/0159864 A1 * 5/2025 Ming ................... H10B 12/482
2025/0267886 A1 * 8/2025 Hasan ................ H10D 30/0195
2025/0267909 A1 * 8/2025 Koh ..................... H10D 30/501
2025/0294723 A1 * 9/2025 Xu ....................... H10B 12/053
2026/0032947 A1 * 1/2026 Lee ...................... H10B 12/485

* cited by examiner

SEMICONDUCTOR DEVICE WITH FLOATING MAIN BODY REGION VERTICALLY SEPARTING SOURCE FROM DRAIN AND METHOD OF FORMING THE SAME

CROSS REFERENCE TO RELATED APPLICATIONS

This application claims priority of Taiwan Patent Application No. 112112224, filed Mar. 30$^{th}$, 2023, the entirety of which is incorporated by reference herein.

BACKGROUND OF THE INVENTION

Field of the Invention

The present disclosure relates to a semiconductor device and a method forming the same, and in particular, to a dynamic random access memory (DRAM) and a method forming the same.

Description of the Related Art

In recent years, a dynamic random access memory (DRAM) on an electrically floating body has been proposed. This memory eliminates the capacitor from the conventional one-transistor and one-capacitor (1T/1C) memory unit, for scaling down the unit dimensions. Furthermore, in comparison with the conventional one-transistor and one-capacitor memory unit, this type of memory can be applied in smaller unit dimensions. However, since the storage charges dissipate through time, this type of dynamic random access memory still requires a refresh procedure. Thus, there remain some issues regarding the semiconductor device and manufacturing technique that need to be overcome.

BRIEF SUMMARY OF THE INVENTION

An embodiment of the present disclosure provides a semiconductor device, the semiconductor device includes a substrate, a source region disposed on the substrate, a drain region disposed on the source region, and a floating main body region disposed between the source region and the drain region. The floating main body region vertically separates the source region from the drain region. The semiconductor device further includes a gate region laterally wrapped around the floating main body region, and a gate dielectric located between the floating main body region and the gate region, and insulated the floating main body region from the gate region. A material of the gate dielectric has a negative capacitance feature.

Another embodiment of the present disclosure provides a method forming a semiconductor device, the method includes providing a substrate, sequentially forming a source region, a floating main body region, and a drain region on the substrate, and forming a gate region wrapped around the floating main body region. The method further includes forming a gate dielectric to insulate the floating main body region from the gate region before forming the gate region. A material of the gate dielectric has a negative capacitance feature.

BRIEF DESCRIPTION OF THE DRAWINGS

The present disclosure can be more fully understood by reading the subsequent detailed description and examples with references made to the accompanying drawings, wherein.

DETAILED DESCRIPTION OF THE INVENTION

In comparison with a conventional one-transistor and one-capacitor (1T/1C) dynamic random access memory (DRAM), a one-transistor (1T) dynamic random access memory omits the capacitor portion, which can also be referred to as a "capacitor less" dynamic random access memory. Since the space for the capacitor is omitted, the feature size of the memory can be more effectively scaled down. Furthermore, the one-transistor dynamic random access memory may generate charging behavior, which causes memory window effect by accumulating and erasing charges. When a source region of the dynamic random access memory no longer needs to be coupled to the capacitor, the source region of the one-transistor dynamic random access memory may be electrically connected to a source line, which can enhance design flexibility to conform to various design requests. For example, the one-transistor dynamic random access memory is integrated into a complementary metal-oxide semiconductor (CMOS).

FIGS. 1-10 illustrate cross-sectional views of various intermediate stages of forming a semiconductor device 10, according to an embodiment of the present disclosure.

Figure 1:
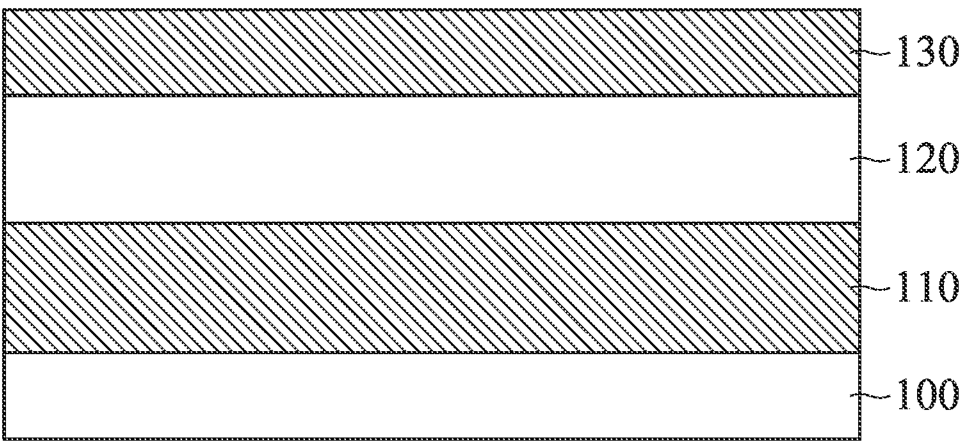
FIGS. 1-10 illustrate cross-sectional views of various intermediate stages of forming a semiconductor device, according to an embodiment of the present disclosure.

Referring to FIG. 1, an initial structure of the semiconductor device 10 may include a substrate 100, a source layer 110, a floating main body layer 120, and a drain layer 130. In an embodiment, the floating main body layer 120 may be disposed between the source layer 110 and the drain layer 130. The floating main body layer 120 separates the source layer 110 from the drain layer 130.

The substrate 100 may be, for example, a wafer or a chip. In an embodiment, the substrate 100 may be a semiconductor substrate, for example, an elemental semiconductor (such as silicon (Si) or germanium (Ge)), a compound semiconductor (such as gallium nitride (GaN), silicon carbide (SiC), gallium arsenide (GaAs), gallium phosphide (GaP), indium phosphide (InP), indium arsenide (InAs), and/or indium antimonide (InSb)), an alloy semiconductor (such as silicon germanium (SiGe) alloy, gallium arsenide phosphide (GaAsP) alloy, aluminum indium arsenide (AlInAs) alloy, aluminum gallium arsenide (AlGaAs) alloy, gallium indium arsenide (GaInAs) alloy, gallium indium phosphide (GaInP) alloy, and/or gallium indium arsenide phosphide (GaInAsP) alloy), or a combination thereof. In a specific embodiment, the substrate 100 may also be a semiconductor on insulator (SOI) substrate.

The substrate 100 may include an isolation structure to define active regions and to electrically isolate active region elements within or above the substrate 100. The isolation structure may include for example shallow trench isolation (STI) structure, deep trench isolation (DTI) structure, and local oxidation of silicon (LOCOS) structure. In an embodiment, the formation of the isolation structure may include, for example, forming an insulating layer on the surface of the substrate 100, and selectively etching the insulating layer and the substrate 100 to form trenches that extend from the surface of the substrate 100 into the substrate 100, wherein the trenches are located between neighboring active regions. Next, the formation of the isolation structure may include growing a liner of rich nitrogen-containing materials (such as silicon oxynitride (SiON) or the like) along the trenches, followed by filling insulating materials into the trenches by a suitable deposition process. An annealing process may then be performed, followed by a planarization process to remove excessive insulating materials, so the insulating materials in the trenches are level with the top surface of the substrate 100.

Next, the source layer 110 may be disposed on the substrate 100. The source layer 110 may be used to form the subsequent source line 112 and source region 115. The thickness of the source layer 110 may be between 1 nm and 300 nm. The source layer 110 may include suitable semiconductor materials, such as elemental semiconductor, compound semiconductor, alloy semiconductor, and may be n-type conductivity or p-type conductivity. The p-type dopants may include boron (B), indium (In), aluminum (Al), and gallium (Ga), while the n-type dopants may include phosphorus (P), arsenic (As), and/or a combination thereof. In a specific embodiment, the source layer 110 may be highly conductive silicon, doped with for example an n-type dopant with the doping concentration between $10^{11}$ and $10^{17}$. The source layer 110 may be formed by epitaxial growth, which may include metal organic chemical vapor deposition (MOCVD), molecular beam epitaxy (MBE), liquid phase epitaxy (LPE), vapor phase epitaxy (VPE), selective epitaxial growth (SEG), and/or a combination thereof.

Next, the floating main body layer 120 may be disposed on the source layer 110. The thickness of the floating main body layer 120 may be between 1 nm and 300 m. The floating main body layer 120 may include suitable semiconductor materials, such as elemental semiconductor, compound semiconductor, alloy semiconductor, and may be n-type conductivity or p-type conductivity. The p-type dopants may include boron, indium, aluminum, and gallium, while the n-type dopants may include phosphorus, arsenic, and/or a combination thereof. In a specific embodiment, the floating main body layer 120 may be intrinsic silicon, doped with for example a p-type dopant with the doping concentration between $10^{11}$ and $10^{17}$. The formation of the floating main body layer 120 may be similar to that of the source layer 110, and the details are not described again herein to avoid repetition.

After that, the drain layer 130 may be formed on the floating main body layer 120. The thickness of the drain layer 130 may be between 1 nm and 300 nm. The materials and the formation of the drain layer 130 may be similar to those of the source layer 110, and the details are not described again herein to avoid repetition.

Figure 2:
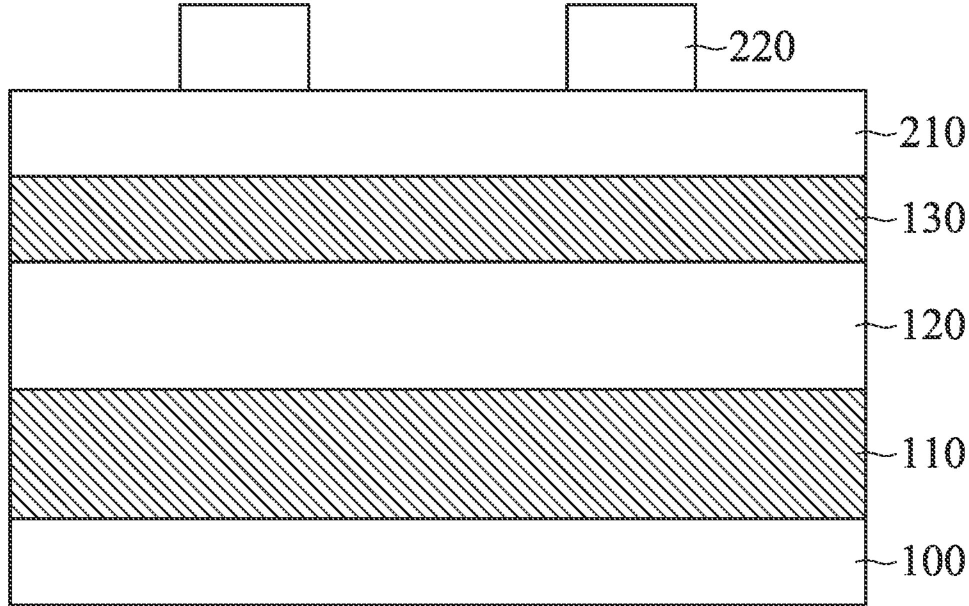

Referring to FIG. 2, a hard mask layer 210 may be formed on the drain layer 130. Although the hard mask layer 210 is illustrated as a single structure, but the hard mask layer 210 may also be a composite structure that includes multiple layers. For example, the hard mask layer 210 may include a carbon hard mask, diamond-like carbon (DLC), a bottom anti-reflective coating (BARC), and an anti-reflective layer. In other embodiments, the materials of the hard mask layer 210 may include polyethylene terephthalate (PET), polycarbonate (PC), polyimide (PI), polymethylmethacrylates (PMMA), polystyrene resin, polyethersulfone (PES), polythiophene (PT), phenol novolac (PN), and/or a combination thereof. The hard mask layer 210 may be formed by for example spin-on coating.

Next, a patterned photoresist 220 may be formed on the hard mask layer 210. The materials and the formation of the patterned photoresist 220 may be similar to those of the hard mask layer 210, and the details are not described again herein to avoid repetition.

Figure 3:
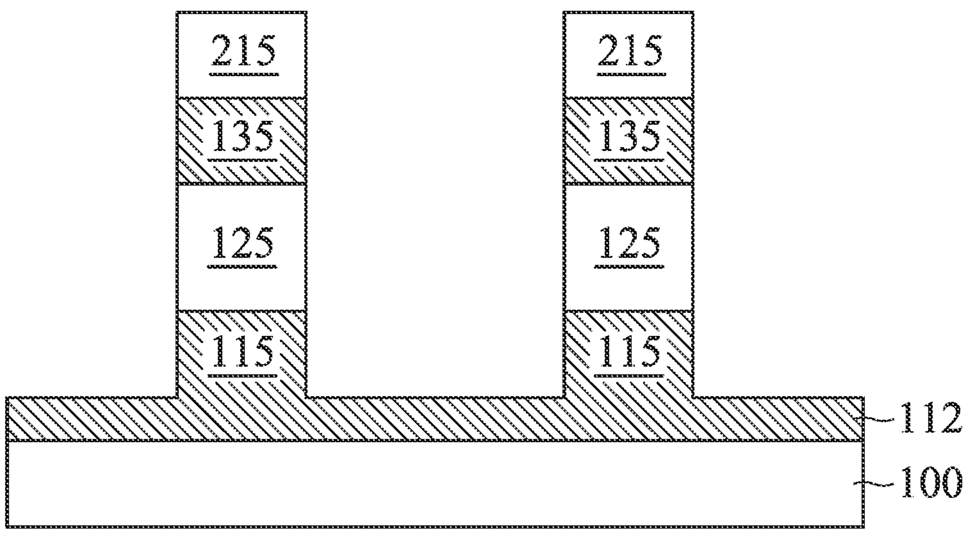

Referring to FIG. 3, the patterned photoresist 220 may serve as a mask to pattern the hard mask layer 210 into a hard mask 215. Next, the pattern of the hard mask 215 is further transferred to the underlying drain layer 130, the floating main body layer 120, and a portion of the source layer 110 to form a drain region 135, a floating main body region 125, and a source region 115, respectively. The hard mask 215, the drain region 135, the floating main body region 125, and the source region 115 may be formed by an etching process. It should be noted that the portion of the source layer 110 that has not be etched becomes a source line 112 electrically connected to the source region 115, in which the source line 112 is a single conductive line disposed on the substrate 100. In an embodiment, performing the etching process using the hard mask 215 can more effectively control the stability of the critical dimension (CD) of the source region 115, the floating main body region 125, and the drain region 135. The source region 115 and the drain region 135 may function as the source terminal and the drain terminal of the transistor, respectively. The floating main body region 125 may vertically separate the source region 115 from the drain region 135, and may function as the channel region between the source terminal and the drain terminal. Moreover, the source line 112 electrically connected to the source region 115 may serve as the element to be biased during the operation of the semiconductor device 10. The width of the source region 115, the floating main body region 125, and the drain region 135 may be between 1 nm and 1 μm. The thickness of the source line 1112 (or the remaining portion of the source layer 110) may be between 1 nm and 1 mm. The etching process may include a dry etching process, a wet etching process, and/or a combination thereof.

Figure 4:
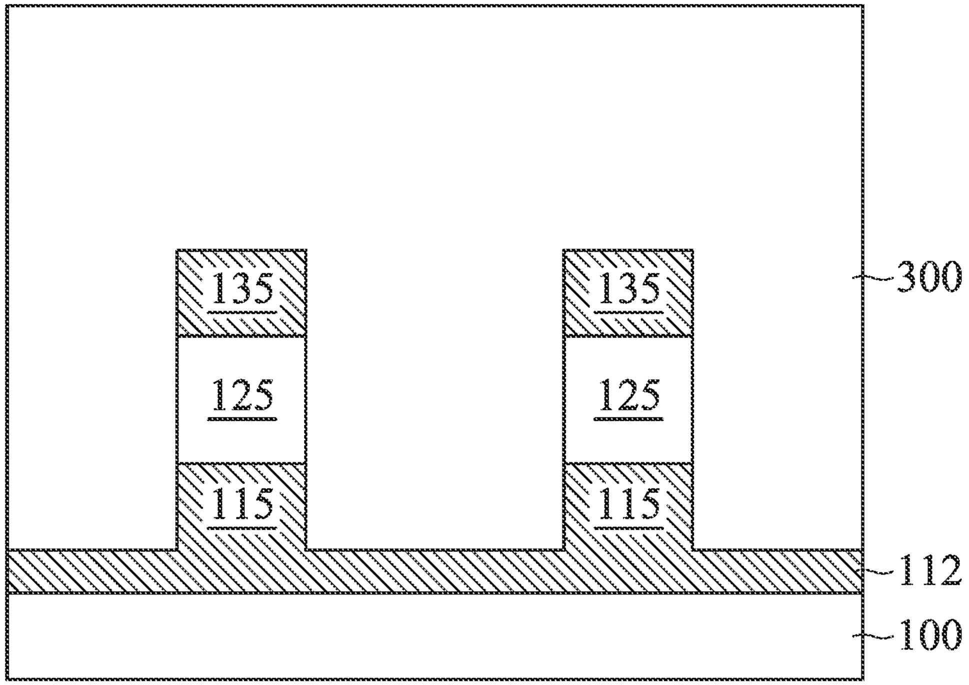

Referring to FIG. 4, an inter-layer dielectric (ILD) 300 may be formed on the exposed surface of the source line 112, on the sidewalls of the source region 115 and the floating main body region 125, and on the sidewall and the top surface of the drain region 135. In an embodiment, the inter-layer dielectric 300 initially covers the source line 112, the source region 115, the floating main body region 125, and the drain region 135. The inter-layer dielectric 300 may provide the mechanical protection for the underlying layers, as well as the electrical insulation from the overlying element. The materials of the inter-layer dielectric 300 may include silicon oxide (SiO), silicon nitride (SiN), silicon carbide, silicon oxynitride, silicon oxycarbonitride (SiOCN), tetra ethyl ortho silicate (TEOS), undoped silicate glass, or doped silicon oxide (such as boron-doped phosphosilicate glass (BPSG), fused silica glass (FSG), phosphosilicate glass (PSG), boron-doped silicate glass (BSG), or the like), low-k dielectric materials, or the like. The inter-layer dielectric 300 may be formed by chemical vapor deposition (CVD), high-density plasma chemical vapor deposition (HDP-CVD), plasma-enhanced chemical vapor deposition (PECVD), low pressure chemical vapor deposition (LPCVD), flowable chemical vapor deposition (FCVD), sub-atmospheric chemical vapor deposition (SACVD), and/or a combination thereof.

Figure 5:
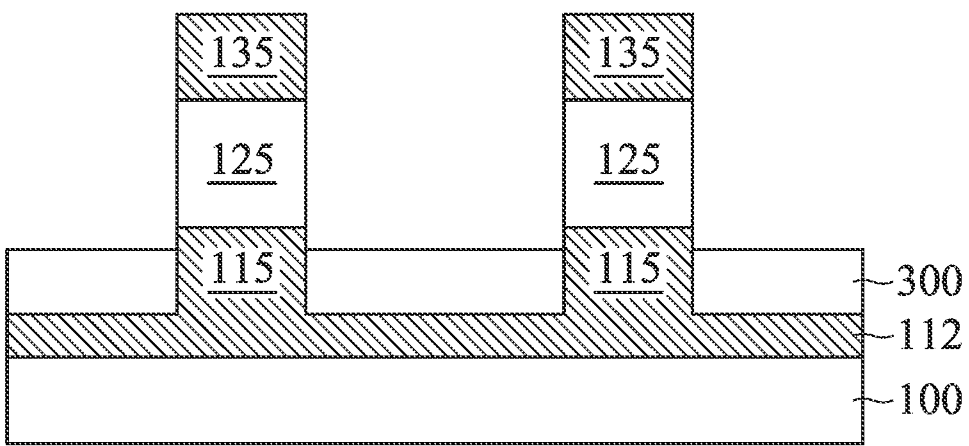

Referring to FIG. 5, the inter-layer dielectric 300 may be thinned. In an embodiment, the top surface of the thinned inter-layer dielectric 300 is below the interface between the source region 115 and the floating main body region 125. In an embodiment, in addition to exposing the drain region 135 and the floating main body region 125, the inter-layer dielectric 300 also needs to expose a portion of the source region 115, so that the subsequently formed gate dielectric 425 and the gate region 435 may span across the sidewall of the source region 115 and the sidewall of the drain region 135. The thickness of the thinned inter-layer dielectric 300 may be between 1 nm and 300 nm. The thinning of the inter-layer dielectric 300 may be performed using an anisotropic recessing, and thus the source region 115, the floating main body region 125, and the drain region 135 are protected from being etched.

Figure 6:
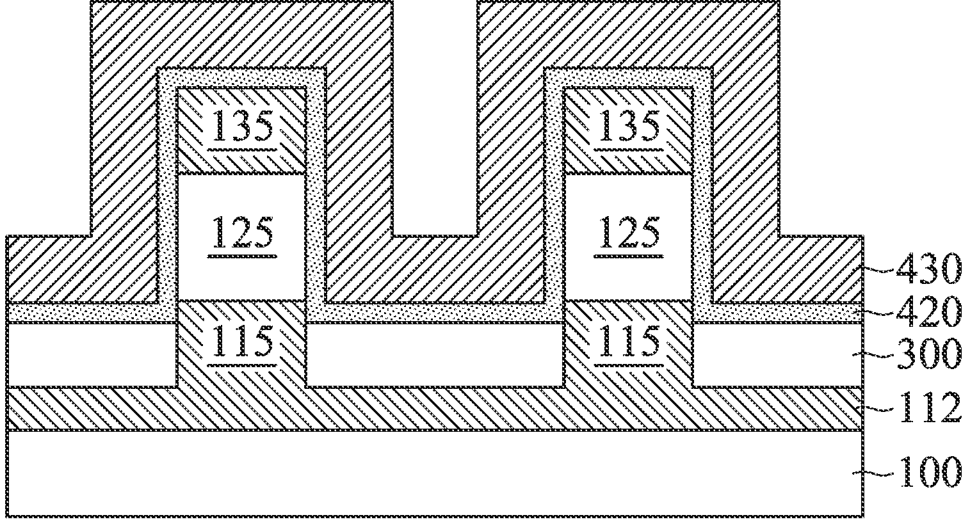

Referring to FIG. 6, a gate dielectric layer 420 may be conformally deposited on the surface of the thinned inter-layer dielectric 300, on the exposed sidewall of the source region 115, on the sidewall of the floating main body region 125, and on the sidewall and the top surface of the drain region 135. In an embodiment, the gate dielectric layer 420 is a continuous structure covering the overall surface of the intermediate structure of the semiconductor device 10. The thickness of the gate dielectric layer 420 may be between 1 nm and 50 nm. The gate dielectric layer 420 may be formed by any suitable deposition process mentioned above.

In an embodiment, the material of the gate dielectric 425 has a negative capacitance (NC) feature, and so the gate dielectric layer 420 has negative capacitance materials. Negative capacitance materials may include ferroelectric material, such as potassium dihydrogen phosphate ($KH_2PO_4$), bismuth ferrite (BFO) ($BiFeO_3$), doped hafnium (IV) oxide ($HfO_2$), zirconium (IV) oxide ($ZrO_2$), perovskite material (such as barium titanate (BTO) ($BaTiO_3$), lead zirconium titanate (PZT) ($Pb(Zr,Ti)O_3$), strontium bismuth tantalate (SBT) ($SrBi_2Ta_2O_9$)), and piezoelectric material (such as aluminum scandium nitride (AlScN)).

It should be specifically explained that the gate dielectric 425 formed of the negative capacitance materials may improve subthreshold swing. It should be appreciated that subthreshold swing is the sensitivity of the conducting current to the operation voltage, or how much bias is needed in order for the current to increase one order. From the plot of current to voltage, the "0" and "1" of the memory unit both demonstrate larger slopes, so the current difference between "0" and "1" under any bias may also be significantly increased, which in turn increases the vertical memory window, so "0" and "1" may be more easily determined. When the subthreshold swing is maintained at a very small value, the switching efficiency of the transistor of the dynamic random access memory may be increased. In addition, the gate dielectric using the negative capacitance material may allow the subthreshold swing to be lower than 60 mV, which is set as an ideal limit of a conventional electronic device.

Still referring to FIG. 6, a gate layer 430 may be conformally deposited on the gate dielectric layer 420. In an embodiment, the gate layer 430 is a continuous structure covering the surface of the gate dielectric layer 420. The thickness of the gate layer 430 may be between 1 nm and 500 nm. The material of the gate layer 430 may include amorphous silicon, polysilicon, poly-SiGe, metal nitride (such as titanium nitride (TiN), tantalum nitride (TaN), tungsten nitride (WN), titanium aluminum nitride (TiAlN), or the like), metal silicide (such as nickel silicide (NiSi), cobalt silicide (CoSi), tantalum silicon nitride (TaSiN), or the like), metal carbide (such as tantalum carbide (TaC), tantalum carbonitride (TaCN), or the like), metal oxide, and metals. Metals may include cobalt (Co), ruthenium (Ru), aluminum (Al), palladium (Pd), platinum (Pt), tungsten (W), copper (Cu), titanium (Ti), tantalum (Ta), silver (Ag), gold (Au), nickel (Ni), and/or a combination thereof. In a specific embodiment, the gate layer 430 may be formed of polysilicon material. The gate layer 430 may be formed by any suitable deposition process mentioned above.

Figure 7:
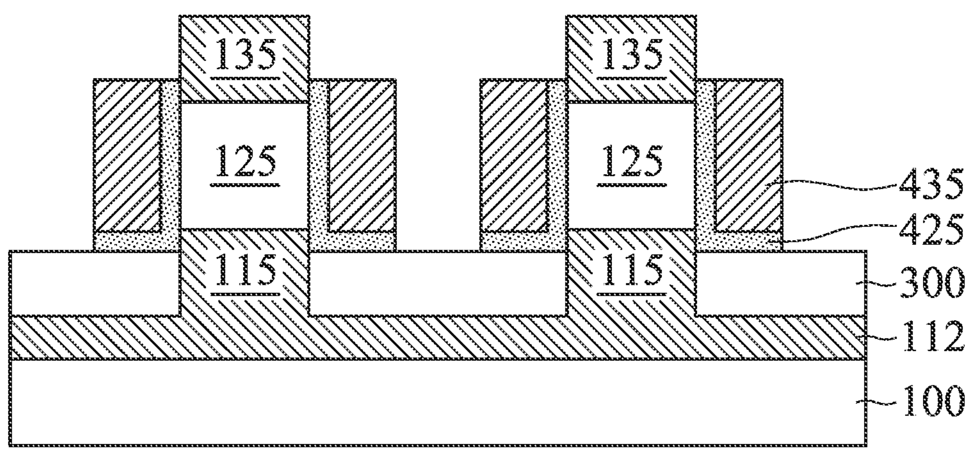

Referring to FIG. 7, a portion of the gate dielectric layer 420 and a portion of the gate layer 430 may be removed. In an embodiment, the horizontal portion (for example, the portion on the surface of the inter-layer dielectric 300 and the portion on the top surface of the drain region 135) and a small segment of the vertical portion (for example, the portion on the sidewall of the drain region 135) of the gate layer 430 are removed. Moreover, the portion of the dielectric layer 420 not covered by the gate layer 430 is removed. The remaining portion of the gate dielectric layer 420 and the remaining portion of the gate layer 430 become the gate dielectric 425 and the gate region 435, respectively. In an embodiment, the gate dielectric 425 and the gate region 435 may laterally wrap around the floating main body region 125, and may extend vertically, reaching the source region 115 and the drain region 135. In other words, in addition to the floating main body region 125, the gate dielectric 425 and the gate region 435 also laterally wrap around a portion of the source region 115 and a portion of the drain region 135. The gate dielectric 425 is located between the floating main body region 125 and the gate region 435, and insulates the floating main body region 125 from the gate region 435, thus preventing the electrical short generated between the gate region 435 and the source region 115 or the drain region 135. The aforementioned portions of the gate dielectric layer 420 and the gate layer 430 may be etched by an anisotropic etch back process (for example, reaction ion etch (RIE), plasma etching, or the like). In an embodiment, one or more etching processes may be performed until the remaining portions of the gate dielectric layer 420 and the gate layer 430 have the desired dimension (namely the gate dielectric 425 and the gate region 435).

Figure 8:
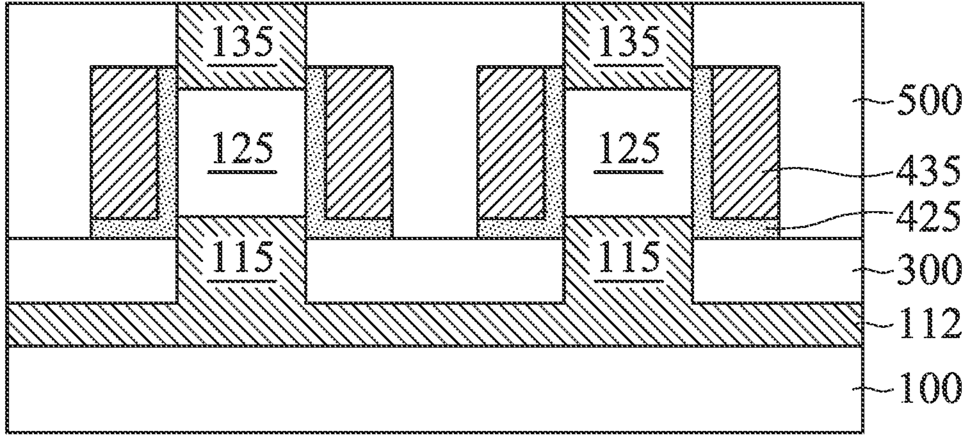

Referring to FIG. 8, an inter-layer dielectric 500 may be formed on the exposed surface of the inter-layer dielectric 300, on the exposed sidewall and the top surface of the drain region 135, on the surface of the gate dielectric 425, and on the surface of the gate region 435. In an embodiment, the inter-layer dielectric 500 covers the overall surface of the intermediate structure of the semiconductor device 10. In an embodiment, the inter-layer dielectric 500 may provide the mechanical protection for the underlying layers, as well as the electrical insulation from the overlying element. The thickness of the inter-layer dielectric 500 may be between 1 nm and 10 μm. The materials and the formation of the inter-layer dielectric 500 may be similar to those of the inter-layer dielectric 300, and the details are not described again herein to avoid repetition. It should be noted that the inter-layer dielectric 300 and the inter-layer dielectric 500 may have the same or different materials. Furthermore, after forming the inter-layer dielectric 500, a planarization process (for example, chemical mechanical polish (CMP), mechanical grinding, or the like) may be performed on the inter-layer dielectric 500 until the top surface of the drain region 135 is exposed, so that the top surface of the inter-layer dielectric 500 is level with the top surface of the drain region 135.

Figure 9:
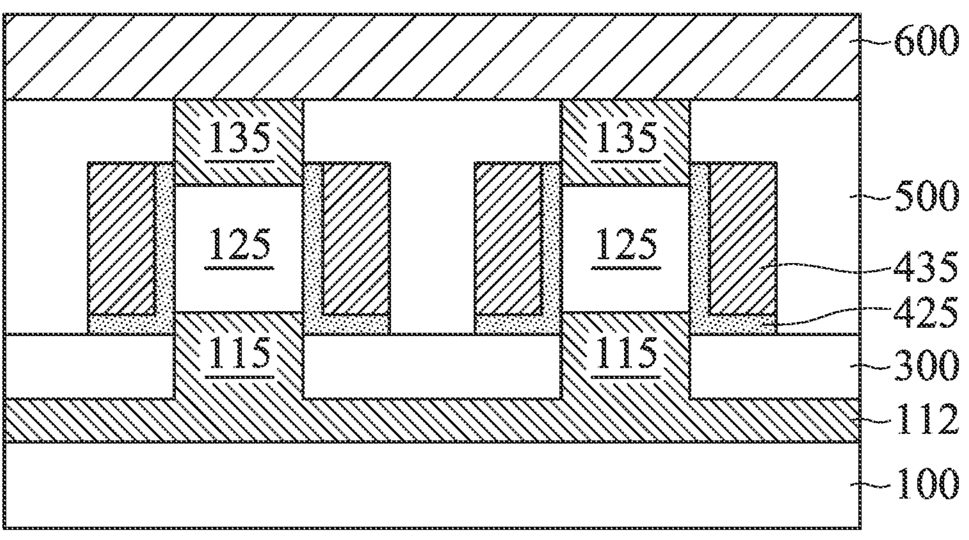

Referring to FIG. 9, a bit line 600 may be formed on the drain region 135 and the inter-layer dielectric 500. In an embodiment, the bit line 600 may be a single metal line that covers the top surface of the drain region 135 and the top surface of the inter-layer dielectric 500. In an embodiment, the bit line 600 may be electrically connected to the drain region 135, and may serve as the element to be biased during the operation of the semiconductor device 10. The thickness of the bit line 600 may be between 1 nm and 1 μm. The materials and the formation of the bit line 600 may be similar to those of the gate layer 430, and the details are not described again herein to avoid repetition.

Figure 10:
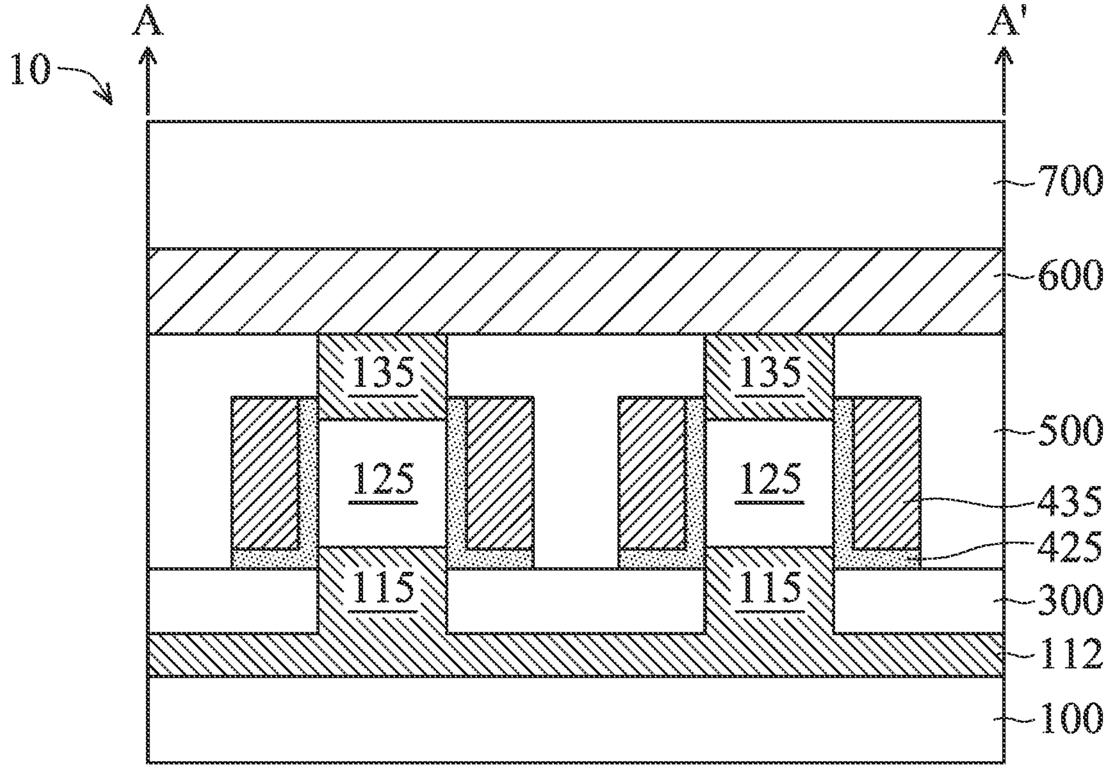

Referring to FIG. 10, an inter-metal dielectric 700 may be formed on the bit line 600. In an embodiment, the inter-metal dielectric 700 may isolate the overlying metal materials from the underlying metal materials to prevent the generation of electrical short. The thickness of the inter-metal dielectric 700 may be between 1 nm and 10 μm. The materials and the formation of the inter-metal dielectric 700 may be similar to those of the inter-layer dielectric 300 or the inter-layer dielectric 500, and the details are not described again herein to avoid repetition.

Figure 11:
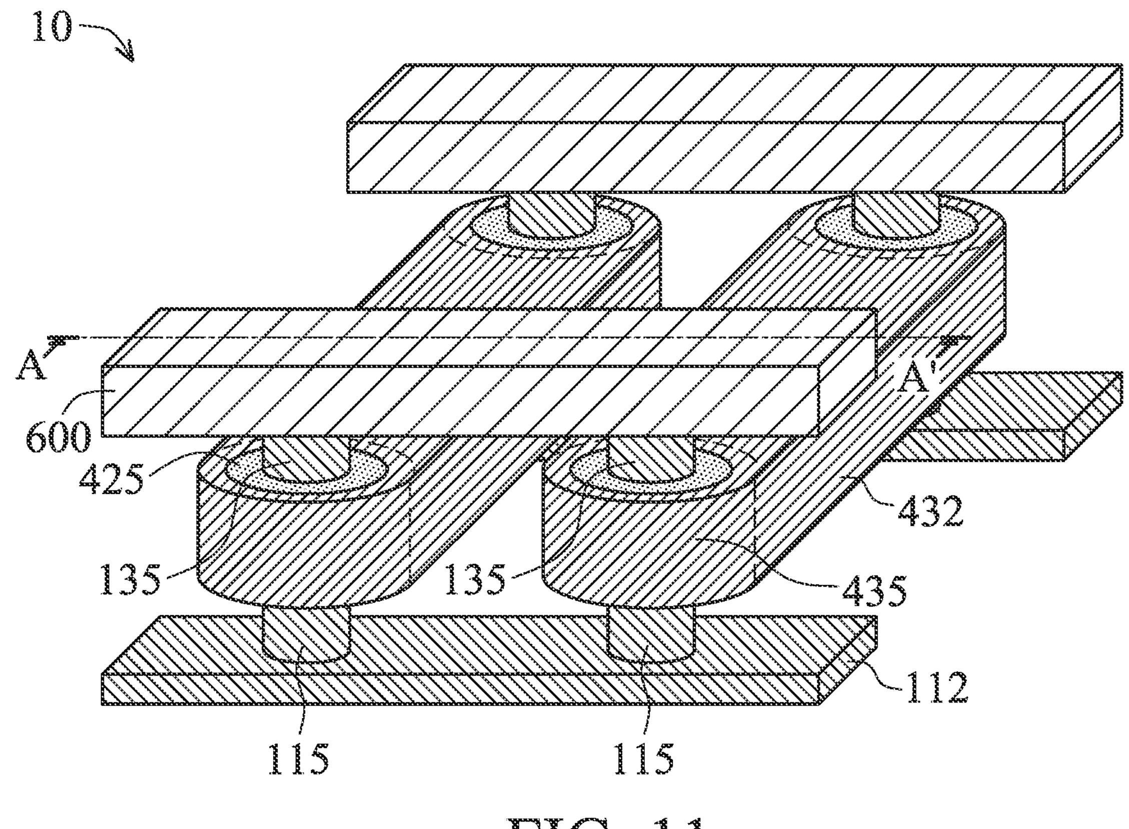
FIG. 11 illustrates a 3D view of the semiconductor device, according to an embodiment of the present disclosure.

FIG. 11 illustrates a 3D view of the semiconductor device 10, according to an embodiment of the present disclosure. It should be noted that FIG. 10 is the cross-sectional view obtained from a line A-A' of FIG. 11. The semiconductor device 10 further includes a word line 432 that connects the gate regions 435 from different areas. For illustrative purpose, the 3D view of the semiconductor device 10 omits the substrate 100, the inter-layer dielectric 300, the inter-layer dielectric 500, and the inter-metal dielectric 700. For simplicity, the features of the source line 112, the source region 115, the drain region 135, the gate dielectric 425, the gate region 435, and the bit line 600 are similar to those illustrated in FIG. 10, and the details are not described again herein to avoid repetition.

Referring to FIG. 11, the source line 112 and the bit line 600 may be electrically connected to the source region 115 and the drain region 135 of a pair of transistor components, respectively. In an embodiment, the word line 432 may be electrically connected to other transistor components (or other transistor components that are not electrically connected by the source line 112 or the bit line 600), and may control the conductivity of the gate structure. It is worth noted that the gate dielectric 425 and the gate region 435 may be a cylindrical structure that wraps around the floating main body region 125 (and a portion of the source region 115 and a portion of the drain region 135). Even though the source region 115, the floating main body region 125, and the drain region 135 are illustrated as circular shape, and the gate dielectric 425 and the gate region 435 are a conformal circular ring from top view, but the present disclosure is not limited thereto. The source region 115, the floating main body region 125, the drain region 135, the gate dielectric 425, and the gate region 435 may have any suitable geometric shape from top view. Furthermore, the word line 432 may be extended outward from the gate region 435, and the extending direction of the word line 432 may be perpendicular to the extending directions of the source line 112 or the bit line 600. The word line 432 and the gate region 435 may be formed together, thus may share the same materials and formation.

Figure 12:
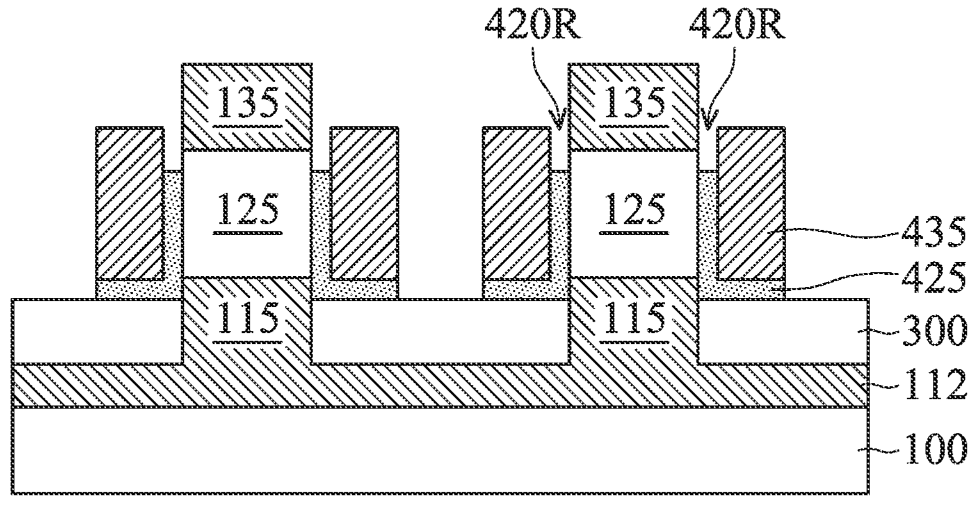
FIGS. 12 and 13 illustrate cross-sectional views of various intermediate stages of forming a semiconductor device, according to an embodiment of the present disclosure.
Figure 13:
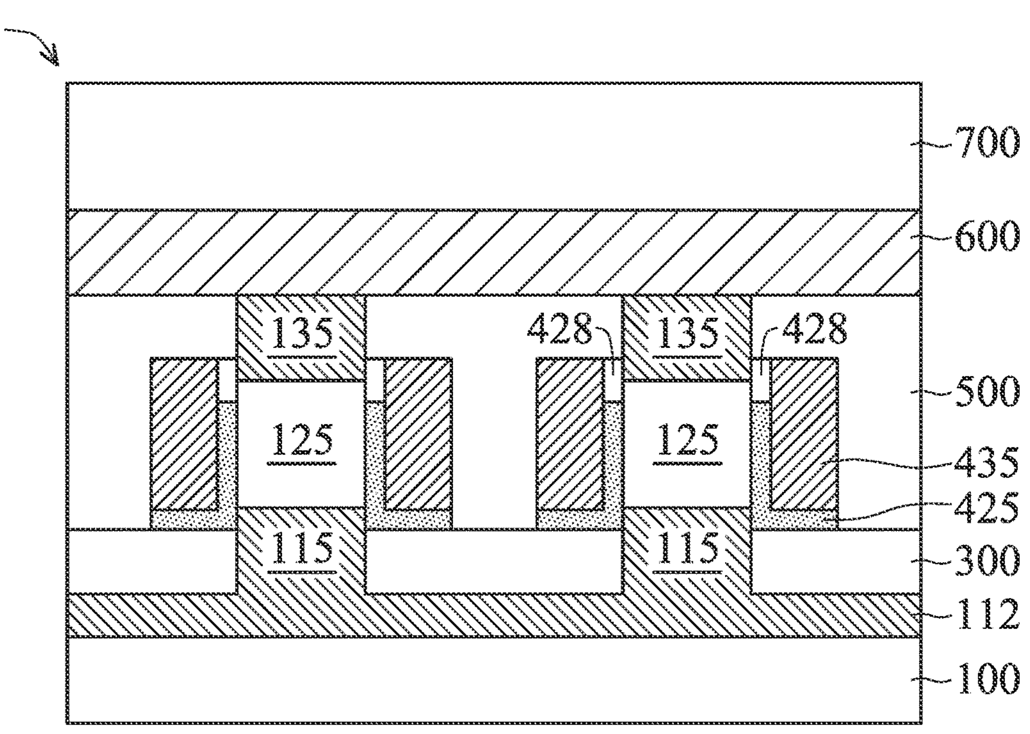

FIGS. 12 and 13 illustrate cross-sectional views of various intermediate stages of forming a semiconductor device 20, according to an embodiment of the present disclosure. In comparison with the semiconductor device 10, the semiconductor device 20 includes forming an air gap 428 in the gate dielectric 425. For simplicity, the features of the substrate 100, the source line 112, the source region 115, the floating main body region 125, the drain region 135, the inter-layer dielectric 300, the gate dielectric 425, the gate region 435, the inter-layer dielectric 500, the bit line 600, and the inter-metal dielectric 700 are similar to those illustrated in FIG. 10, and the details are not described again herein to avoid repetition.

Referring to FIG. 12, in comparison with FIG. 7, a recess 420R may be further formed at the top of the gate dielectric 425. For simplicity, the procedures from FIG. 1 to FIG. 6 are omitted. In an embodiment, the recess 420R may be sealed to become the air gap 428 in subsequent manufacturing process. The depth of the recess 420R may be between 0 nm and 100 nm. The top surface of the remaining portion of the gate dielectric layer 420 (for example, the gate dielectric 425) may be etched below the top surface of the remaining portion of the gate layer 430 (for example, the gate region 435) by a suitable etching process (for example, a dry etching or a wet etching that are highly selectively to the gate dielectric layer 420) to form the recess 420R between the floating main body region 125 and the gate region 435.

Referring to FIG. 13, in comparison with FIG. 10, the recess 420R may be sealed by the inter-layer dielectric 500 to become the air gap 428. For simplicity, the procedures of FIG. 8 and FIG. 9 are omitted. Since the lateral dimension (for example, the width) of the recess 420R is extremely small, the deposition of the inter-layer dielectric 500 does not fill into the recess 420R. The gate dielectric 425 and the gate region 435 may wrap around the floating main body region 125, and may extend vertically, reaching the source region 115 and the drain region 135. However, the semiconductor device 20 has the air gap 428 reaching the drain region 135 and the gate dielectric 425 reaching the source region 115. From the perspective of the floating main body region 125, the portion of the gate dielectric 425 close to the source region 115 and the portion of the gate dielectric 425 close the drain region 135 may appear to be an asymmetrical configuration.

In an embodiment, the asymmetrical configuration of the gate dielectric 425 may also be considered as having the heterogeneous material at the drain side (for example, the air gap 428). Since air itself has poor electric field effect, the current channel from the source region 115 to the drain 135 may be cut off when it passes through the air gap 428. More electron-hole pairs may be generated close to the position where the gate dielectric 425 adjoins the air gap 428 in the floating main body region 125. The accumulated charges may also lead to the conducting bias difference between "0" and "1" under any current to be significantly increased, which increases the lateral memory window, so "0" and "1" may be more easily determined. It should be appreciated that the vertical memory window and the lateral memory window are independent from each other. In summary, the gate dielectric 425 using the negative capacitance material may improve the vertical memory window, while forming the air gap 428 may improve the lateral memory window, which in turn optimizing the overall memory window.

FIGS. 14-18 illustrate cross-sectional views of various intermediate stages of forming a semiconductor device 30, according to an embodiment of the present disclosure. In comparison with the semiconductor device 10, the semiconductor device 30 includes forming an interfacial layer 415 before forming the gate dielectric 425. For simplicity, the features of the substrate 100, the source line 112, the source region 115, the floating main body region 125, the drain region 135, the inter-layer dielectric 300, the gate dielectric 425, the gate region 435, the inter-layer dielectric 500, the bit line 600, and the inter-metal dielectric 700 are similar to those illustrated in FIG. 10, and the details are not described again herein to avoid repetition.

Figure 14:
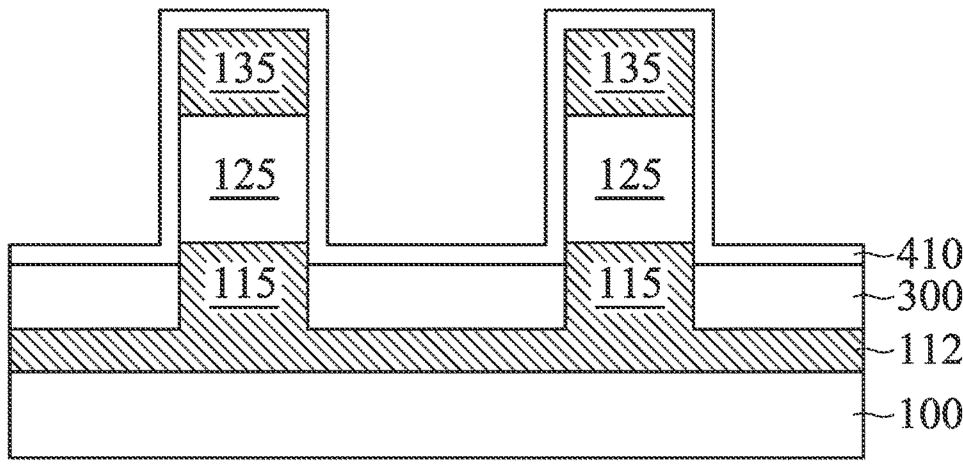
FIGS. 14-18 illustrate cross-sectional views of various intermediate stages of forming a semiconductor device, according to an embodiment of the present disclosure.

Referring to FIG. 14, an interfacial material layer 410 may be conformally deposited on the intermediate structure of FIG. 5 (for example, on the surface of the thinned inter-layer dielectric 300, on the exposed surface of the source region 115, on the sidewall of the floating main body region 125, and on the sidewall and the top surface of the drain region 135). For simplicity, the procedures from FIG. 1 to FIG. 5 are omitted. In an embodiment, the interfacial material layer 410 is a continuous structure that covers the overall surface of the intermediate structure of the semiconductor device 30. In an embodiment, the interfacial material layer 410 may be used to form the subsequent interfacial layer 415. The thickness of the interfacial material layer 410 may be between 1 nm and 50 nm. The materials of the interfacial material layer 410 may include high-k dielectric materials (for example, materials with the dielectric constant larger than 7), which may include hafnium (IV) oxide, hafnium silicate ($HfSiO_4$), hafnium silicon oxynitride (HfSiON), hafnium aluminum oxide (HfAlO), hafnium lanthanum oxide (HfLaO), hafnium zirconium oxide (HfZrO), hafnium tantalum oxide (HfTaO), hafnium titanium oxide (HfTiO), lanthanum oxide (LaO), aluminum oxide (AlO), aluminum silicon oxide (AlSiO), zirconium (IV) oxide, titanium oxide (TiO), tantalum oxide ($Ta_2O_5$), yttrium oxide ($Y_2O_3$), silicon oxynitride, silicon dioxide ($SiO_2$), or the like.

Figure 15:
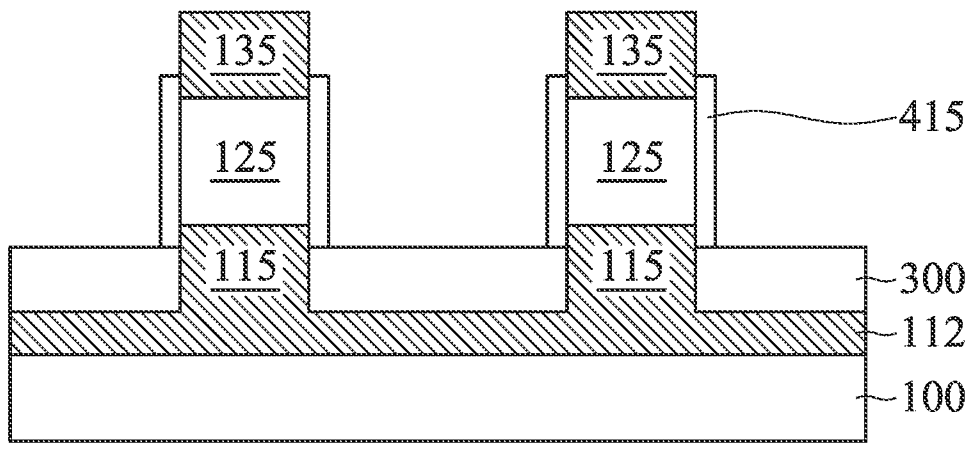

Referring to FIG. 15, a portion of the interfacial material layer 410 may be removed. In an embodiment, the horizontal portion (for example, the portion on the surface of the inter-layer dielectric 300 and the portion on the top surface of the drain region 135) and a small segment of the vertical portion (for example, the portion on the sidewall of the drain region 135) of the interfacial material layer 410 are removed. The remaining portion of the interfacial material layer 410 becomes the interfacial layer 415. In an embodiment, the interfacial layer 415 may be located between the floating main body region 125 and the subsequently formed gate dielectric 425, and may isolate the floating main body region 125 from the subsequently formed gate dielectric 425. The formation of the interfacial layer 415 may be similar to that of the gate dielectric 425 or the gate region 435, and the details are not described again herein to avoid repetition.

Figure 16:
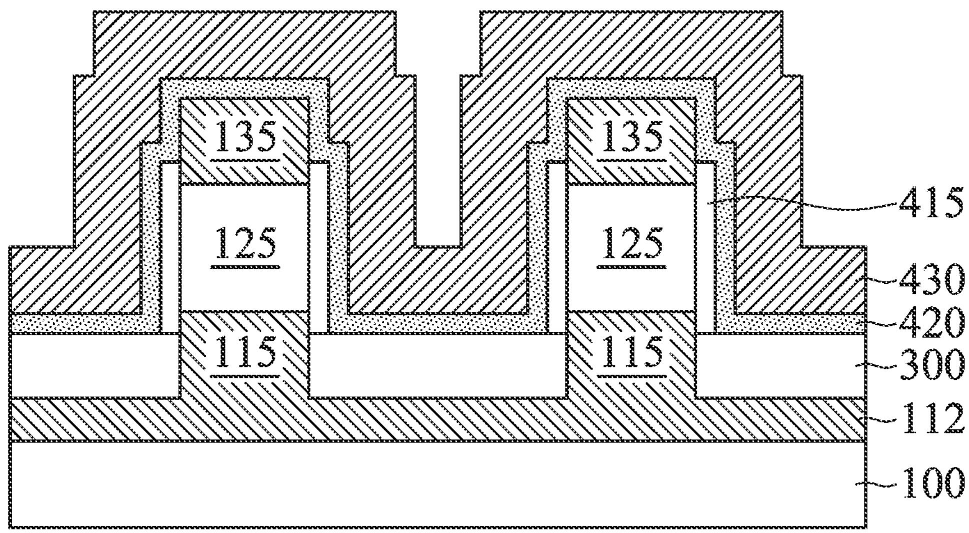

Referring to FIG. 16, in comparison with FIG. 6, the gate dielectric layer 420 and the gate layer 430 may be conformally and sequentially deposited on the intermediate structure of FIG. 15. In an embodiment, the gate dielectric layer 420 and the gate layer 430 are continuous structures covering the overall surface of the intermediate structure (including the interfacial layer 415) of the semiconductor device 30. The thicknesses, the materials, and the formation of the gate dielectric layer 420 and the gate layer 430 may be similar to those illustrated in FIG. 10, and the details are not described again herein to avoid repetition.

Figure 17:
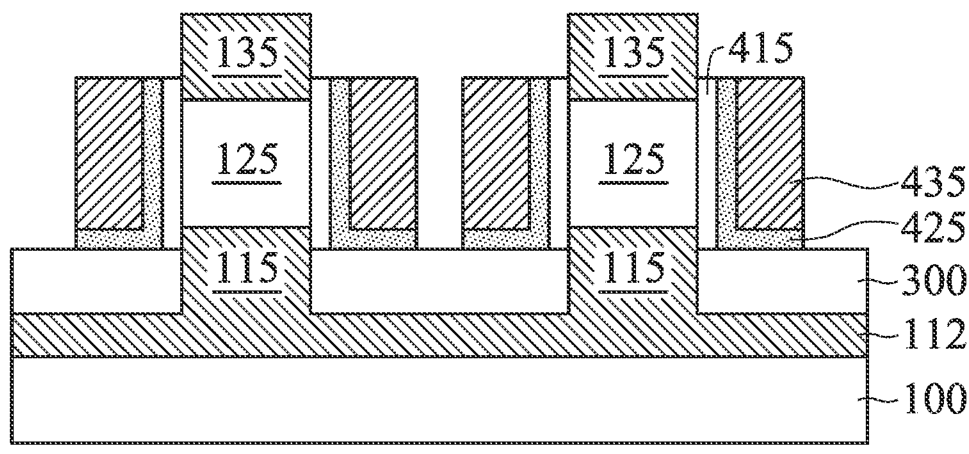

Referring to FIG. 17, in comparison with FIG. 7, a portion of the gate dielectric layer 420 and a portion of the gate layer 430 may be removed. The remaining portion of the gate dielectric layer 420 and the remaining portion of the gate layer 430 become the gate dielectric 425 and the gate region 435, respectively. The interfacial layer 415 may be located between the floating main body region 125 and the gate dielectric 425, and may separate the floating main body region 125 from the gate dielectric 425. The formations of the gate dielectric 425 and the gate region 435 may be similar to those illustrated in FIG. 10, and the details are not described again herein to avoid repetition.

Figure 18:
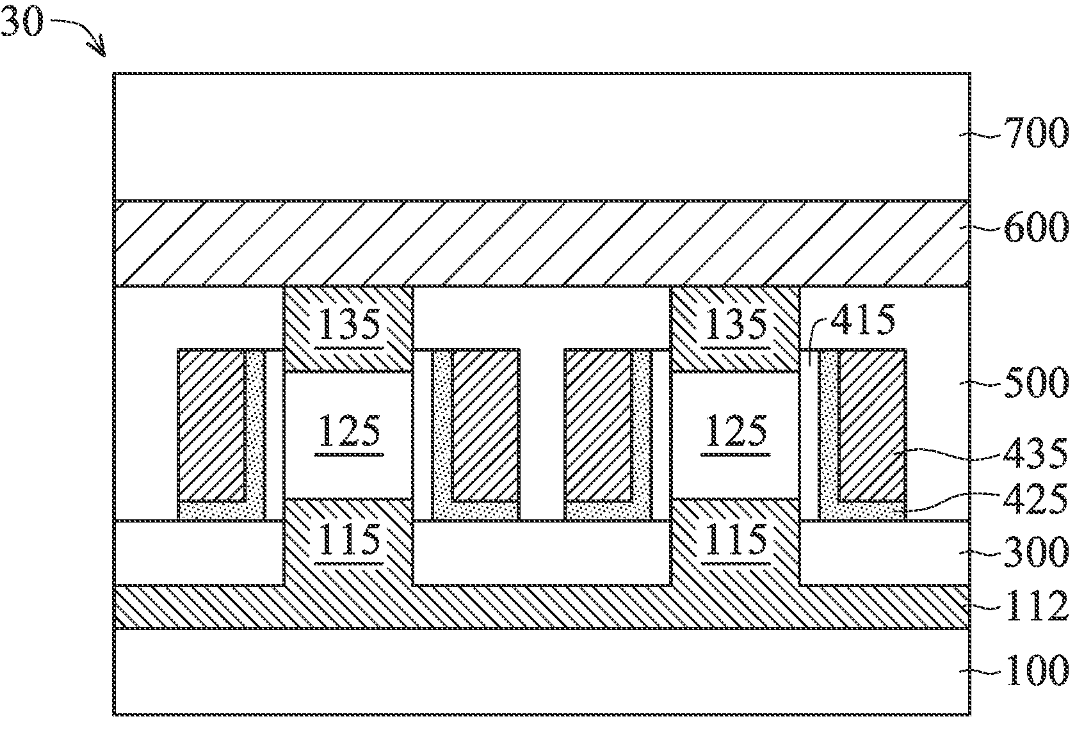

Referring to FIG. 18, in comparison with FIG. 10, the interfacial layer 415 may be further covered by the inter-layer dielectric 500. For simplicity, the procedures of FIG. 8 and FIG. 9 are omitted. In an embodiment, the interfacial layer 415, the gate dielectric 425, and the gate region 435 may wrap around the floating main body region 125, and may extend vertically, reaching the source region 115 and the drain region 135. In an embodiment, the interfacial layer 415 may have the material similar to that of the conventional gate dielectric, while the material of the gate dielectric 425 has the negative capacitance feature. In the present embodiment, the interfacial layer 415 and the gate dielectric 425 may be considered collectively as the "bi-layer gate dielectric structure" of the semiconductor device 30. It should be appreciated that when the negative capacitance material of the gate dielectric 425 is in contact with the silicon material of the floating main body region 125 (and the source region 115 and the drain region 135), potential defects may be induced at the interface between the floating main body region 125 and the gate dielectric 425. The interfacial layer 415 may functioned as a buffer between the floating main body region 125 and the gate dielectric 425 in order to lower the probability of generating the potential defects, which in turn enhancing the reliability of the semiconductor device 30.

Figure 19:
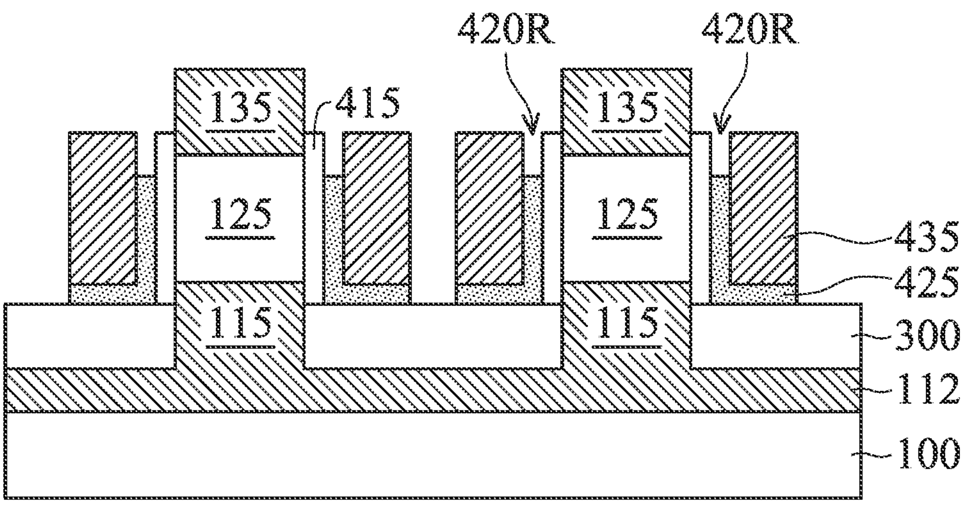
FIGS. 19 and 20 illustrate cross-sectional views of various intermediate stages of forming a semiconductor device, according to an embodiment of the present disclosure.
Figure 20:
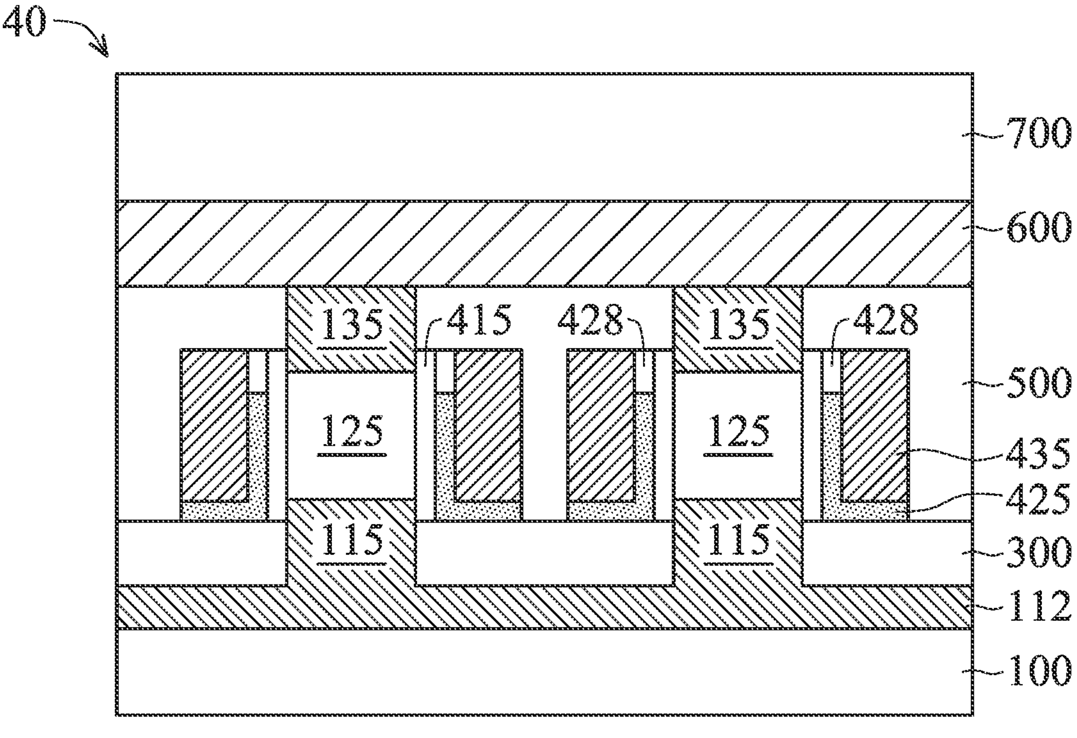

FIGS. 19 and 20 illustrate cross-sectional views of various intermediate stages of forming a semiconductor device 40, according to an embodiment of the present disclosure. In comparison with the semiconductor device 10, the semiconductor device 40 combines the feature of the air gap 428 of the semiconductor device 20 and the feature of the interfacial layer 415 of the semiconductor device 30. For simplicity, the features of the substrate 100, the source line 112, the source region 115, the floating main body region 125, the drain region 135, the inter-layer dielectric 300, the gate dielectric 425, the gate region 435, the inter-layer dielectric 500, the bit line 600, and the inter-metal dielectric 700 are similar to those illustrated in FIG. 10, and the details are not described again herein to avoid repetition.

Referring to FIG. 19, the recess 420R may be further formed in the gate dielectric 425 of FIG. 17. In comparison with FIG. 12, since the interfacial layer 415 is disposed between the floating main body region 125 and the gate dielectric 425, the recess 420R is located between the interfacial layer 415 and the gate region 435. The features of the recess 420R and the interfacial layer 415 are similar to those respectively illustrated in semiconductor device 20 and in semiconductor device 30, and the details are not described again herein to avoid repetition.

Referring to FIG. 20, the recess 420R may be sealed by the inter-layer dielectric 500 to become the air gap 428. Since the lateral dimension (for example, the width) of the recess 420R is extremely small, the deposition of the inter-layer dielectric 500 does not fill the recess 420R. Furthermore, the interfacial layer 415, the gate dielectric 425, and the gate region 435 may wrap around the floating main body region 125, and may extend vertically, reaching the source region 115 and the drain region 135. It should be noted that the semiconductor device 40 combines the gate dielectric 425 with the negative capacitance material, the air gap 428, and the interfacial layer 415, so the vertical memory window (for larger current difference), the lateral memory window (for larger bias difference), and the reliability of the semiconductor device 40 may be simultaneously improved.

The semiconductor device of the present disclosure includes the dynamic random access memory having the innovative gate dielectric, in which the material of the gate dielectric has a negative capacitance feature that can improve the subthreshold swing. From the plot of current to voltage, the "0" and "1" of the memory unit both demonstrate larger slopes, so the current difference between "0" and "1" may be significantly increased, which in turn increases the vertical memory window. "0" and "1" may be more easily determined, so the switching efficiency of the transistor of the dynamic random access memory may be increased. Furthermore, the gate dielectric of the negative capacitance material may be combined with the air gap and/or the interfacial layer. The formation of the air gap in the gate dielectric may allow the gate dielectric to appear to be an asymmetrical configuration. Since air itself has poor electric field effect, the current channel from the source region to the drain region may be cut off when it passes through the air gap. More electron-hole pairs may be generated. The accumulated charges may also lead to the conducting bias difference between "0" and "1" to be significantly increased, which increases the lateral memory window, so "0" and "1" may be more easily determined. The disposition of the interfacial layer between the gate dielectric and the floating main body region can lower the probability of generating potential defects, which in turn enhancing the reliability of the semiconductor device.

Although some embodiments of the present disclosure are disclosed above, they are not intended to limit the scope of the present disclosure. Those skilled in the art may make various changes, substitutions, and alterations herein without departing from the spirit and scope of the present disclosure. Therefore, the scope of protection should be determined through the claims.

What is claimed is:

1. A semiconductor device, comprising:

a substrate;

a source region disposed on the substrate;

a drain region disposed on the source region;

a floating main body region disposed between the source region and the drain region, wherein the floating main body region vertically separates the source region from the drain region;

a gate region laterally wrapped around the floating main body region, wherein the gate region wraps around a portion of the source region and a portion of the drain region; and a gate dielectric located between the floating main body region and the gate region, and insulated the floating main body region from the gate region, wherein a material of the gate dielectric has a negative capacitance (NC) feature, wherein the gate dielectric comprises an air gap in contact with the drain region, wherein, from the perspective of the floating main body region, a portion of the gate dielectric close to the source region and a portion of the gate dielectric close to the drain region appear to be an asymmetrical configuration.

2. The semiconductor device of claim 1, further comprising a source line disposed on the substrate, wherein the source line is electrically connected to the source region.

3. The semiconductor device of claim 2, further comprising a word line extended outward from the gate region, wherein an extending direction of the word line is perpendicular to an extending direction of the source line.

4. The semiconductor device of claim 2, further comprising an inter-layer dielectric (ILD) covering the source line.

5. The semiconductor device of claim 4, wherein a top surface of the inter-layer dielectric is lower than an interface between the source region and the floating main body region.

6. The semiconductor device of claim 1, further comprising an inter-layer dielectric covering the gate region.

7. The semiconductor device of claim 6, further comprising a bit line disposed on the inter-layer dielectric, wherein the bit line is electrically connected to the drain region.

8. The semiconductor device of claim 7, further comprising an inter-metal dielectric (IMD) disposed on the bit line.

9. The semiconductor device of claim 1, further comprising an interfacial layer located between the floating main body region and the gate dielectric, and separates the floating main body region from the gate dielectric.

10. A method of forming a semiconductor device, comprising:

providing a substrate;

sequentially forming a source region, a floating main body region, and a drain region on the substrate by sequentially depositing a source layer, a floating main body layer, and a drain layer on the substrate, followed by patterning the drain layer, the floating main body layer, and a portion of the source layer, wherein a portion of the source layer not patterned becomes a source line electrically connected to the source region;

forming a gate region wrapping around the floating main body region, wherein the gate region wraps around a portion of the source region and a portion of the drain region; and forming a gate dielectric wrapping around the floating main body region before forming the gate region, wherein a material of the gate dielectric has a negative capacitance feature, wherein the gate dielectric layer and the gate layer are conformally deposited on an exposed surface of the source line, on sidewalls of the source region and the floating main body region, and on a sidewall and a top surface of the drain region, followed by etching back the gate dielectric layer and the gate layer.

11. The method of claim 10, further comprising forming an inter-layer dielectric covering the source region, the floating main body region, and the drain region before conformally depositing the gate dielectric layer and the gate layer, followed by etching the inter-layer dielectric to expose the drain region, the floating main body region, and a portion of the source region.

12. The method of claim 10, further comprising conformally depositing an interfacial material layer on the exposed surface of the source line, on the sidewalls of the source region and the floating main body region, and on the sidewall and the top surface of the drain region before conformally depositing the gate dielectric layer and the gate layer.

13. The method of claim 12, further comprising etching back the interfacial material layer to become an interfacial layer, wherein a material feature of the interfacial layer is different from a material feature of the gate dielectric.

14. The method of claim 10, wherein etching back the gate dielectric layer and the gate layer further comprising etching a top surface of the gate dielectric layer below a top surface of the gate layer to form a recess between the floating main body region and the gate region.

15. The method of claim 14, further comprising forming an inter-layer dielectric covering the gate dielectric and the gate region, wherein the inter-layer dielectric seals the recess to become an air gap.

* * * * *